(12) United States Patent
Saito et al.

(10) Patent No.: US 6,712,625 B2
(45) Date of Patent: Mar. 30, 2004

(54) ELECTRONIC COMPONENT AND A METHOD OF MANUFACTURING THE SAME

(75) Inventors: Kazuhisa Saito, Tokyo (JP); Asuka Hosoda, Tokyo (JP); Hiroshi Akimoto, Tokyo (JP)

(73) Assignee: Japan Aviation Electronics Industry Limited, Tokyo (JP)

( * ) Notice: Subject to any disclaimer, the term of this patent is extended or adjusted under 35 U.S.C. 154(b) by 0 days.

(21) Appl. No.: 09/844,226

(22) Filed: Apr. 27, 2001

(65) Prior Publication Data

US 2002/0049008 A1 Apr. 25, 2002

(30) Foreign Application Priority Data

Oct. 25, 2000 (JP) ........................................ 2000/325843

(51) Int. Cl.[7] .............................................. H01R 12/00
(52) U.S. Cl. .......................................... 439/83; 439/886
(58) Field of Search .......................... 439/83, 886, 876, 439/874; 29/885

(56) References Cited

U.S. PATENT DOCUMENTS

| | | |
|---|---|---|
| 3,989,331 A | 11/1976 | Hanlon |
| 4,087,906 A | 5/1978 | Cobaugh et al. |
| 5,453,017 A | 9/1995 | Belopolsky |
| 5,916,695 A * | 6/1999 | Fister et al. ................. 439/886 |
| 5,957,736 A * | 9/1999 | Moriuchi et al. ........... 439/886 |
| 6,049,039 A | 4/2000 | Fushimi |
| 6,164,983 A * | 12/2000 | Lemke et al. ................. 439/83 |
| 6,241,535 B1 * | 6/2001 | Lemke et al. ................. 439/83 |
| 6,203,387 B1 * | 3/2002 | Daly et al. ................... 439/886 |

FOREIGN PATENT DOCUMENTS

JP     08213070     8/1996

* cited by examiner

Primary Examiner—Renee Luebke
Assistant Examiner—Felix O. Figueroa
(74) Attorney, Agent, or Firm—David N. Lathrop, Esq.; Gallagher & Lathrop

(57) ABSTRACT

An electronic component is obtained by forming a primer plating layer of a material which is poorly wettable to a weld brazing material 3 on a base member 11X of a contact 11 having a terminal section 111 for brazing and a contact section 112, and then forming a finish plating layer of a material which is highly wettable to the weld brazing material on the primer plating layer. An exposed region of the poorly wettable primer plating layer is formed thereafter by selectively removing a portion of the finish plating layer at the terminal section 111 and served as an arresting region for arresting the weld brazing material 3 from creeping up and migrating along the highly wettable plating layer in brazing the terminal section 111 to the brazing pad 22 of a wiring board 2.

18 Claims, 8 Drawing Sheets

ELECTRONIC COMPONENT AND A METHOD OF MANUFACTURING THE SAME

BACKGROUND OF THE INVENTION

1. Field of the Invention

This invention relates to an electronic component having a contact for brazing and a method of manufacturing the same, and particularly to a novel method of forming on the contact an arresting region for arresting a weld brazing material from creeping up or climbing up a finish plating layer formed on the contact which layer is a film highly wettable to the weld brazing material, and to an electronic component having such arresting region.

2. Description of the Related Art

The related prior art will be described with reference to FIGS. 1 and 2.

An electronic component 10 comprises a contact 11 and a holder 12 of insulating material molded integrally with the contact 11 so as to hold it. The contact 11 comprises a terminal section 111 to be brazed to a plating layer 21A formed around the inner peripheral surface of a through-hole 21 which is formed through a wiring board 2, and a contact section 112 adapted to electrically contact with another electronic component. A strip of weld brazing material 3 such as solder is pre-applied to a brazing pad 22 which is connected to a wiring conductor (not shown) formed on the undersurface of the wiring board 2.

The terminal section 111 of the contact 11 has its surface plated with tin or gold which is a material highly wettable to the weld brazing material. With such plated terminal section 111 inserted in the through-hole 21 coated with the plating layer 21A (FIG. 1), the weld brazing material 3 applied to the undersurface of the wiring board 2 is heat-fused to electro-mechanically connect the terminal section 111, the through-hole plating layer 21A and the brazing pad 22 together by means of brazing whereby the terminal section 111 is mounted to the wiring board 2 to constitute the electronic component 10.

During this brazing process, as the heat-fused weld brazing material 3 is drawn up (which will be referred to as "creeping up" hereinafter) along the terminal section 111 beyond the upper surface of the board 2 while wetting the highly wettable plating layer of the surface of the terminal section 111, the amount of the weld brazing material 3 is correspondingly reduced in the bonding region between the terminal section 111 and the through-hole plating layer 21A. As the heating is repeated a plurality of times, the weld brazing material will run short, ultimately leading to incomplete electro-mechanical connection between the terminal section 111 and the through-hole plating layer 21A.

One approach proposed to solving the problem of shortage of the weld brazing material between the terminal section 111 of the contact 11 and the through-hole 21 due to the creeping-up of the brazing material is to form an oxide film region 113 on the terminal section 111 by oxidizing a corresponding surface portion thereof so that the oxide film region 113 serves as means for arresting the creeping-up of the weld brazing material 3 on a portion of the terminal section 111 (refer to the Published Japanese Patent application No. 8-213070 for particulars).

Specifically, the oxide film region 113 is shaped in a band shape and formed around the terminal section 111 of the contact 11 where the heat-fused weld brazing material 3 can creep up, by oxidizing at a corresponding band portion of the highly wettable tin plating or gold plating layer of the terminal section 111. The oxide film region 113 in a band shape thus obtained by oxidation of the surface plating layer is poorly wettable with respect to the weld brazing material 3, so that the heat-fused weld brazing material 3 may not overreach.

However, since this oxide film is nothing more than what is produced by oxygen atoms combining with atoms of the tin or gold forming the surface layer of the terminal section, it is not possible to visually determine whether the surface of the tin plating or gold plating layer deposited on the surface of the terminal section 111 has actually been treated by formation of an oxide film or whether the treatment by oxide film formation has been effected in proper location and geometry on the terminal section 111.

Illustrated in FIGS. 3a–3c is another example of the prior art approach to solving the problem of shortage of the weld brazing material at the terminal section of the contact, in which a nickel plating layer 11A is formed as a primer layer over the entire surface of the contact 11, followed by coating the contact section 112 with a relatively thick gold plating 112A of 0.4 μm thickness while coating the terminal section 111 with a relatively thin gold plating layer 111A of 0.05 μm thickness for brazing use, with a predetermined spacing (0.3 mm) between the coated contact section 112 and terminal section 111 to leave therebetween an exposed section of the nickel plating layer, which is then transformed into a nickel oxide layer 113' by anodic oxidation to define an arresting region for arresting the creeping-up of the molten weld brazing material (refer to the Published Japanese Patent Application No. 10-247535 for particulars).

This nickel oxide layer 113' is a poorly wettable region, which the heat-fused weld brazing material 3 cannot overreach to thereby be prevented from creep up and migrate any further.

Nevertheless, in the prior art example of FIGS. 3a to 3c it is difficult to reduce the width of the nickel oxide layer 113' to as narrow as less than 0.2 mm.

Processing with the use of liquid (such as plating and coating) is inferior in accuracy in controlling the location and area where such processing is to be conducted. Especially, the plating process requires the operations of controlling the liquid level and using a tape or a jig for masking, leading to deterioration in the accuracy in the location where the plating region is to be formed. Consequently, it is difficult to conduct the plating process consistently with tolerances less than 1 mm.

Specifically, the accuracy in the location and width of the portion of the nickel layer which should be left bare is not so high, since it is affected by the working accuracy both in the location where the gold plating layer is applied on the contact section 112 and in the location where the gold plating layer for brazing is applied on the terminal section 111. This can make the volume production infeasible for minute electrical terminals having a terminal length less than 2 mm.

In addition, the oxide film thus formed cannot be visually determined as to whether the treatment has been actually completed or not. Similar problems would also arise in the case where the formation of a nickel oxide layer by anodizing is conducted prior to the formation of the gold plating layer on the contact section 112 and the gold plating layer for brazing on the terminal section 111.

As will be appreciated from the foregoing discussion, the 'creeping-up' problem of the weld brazing material 3 in the contact as illustrated in FIGS. 1–3 has not yet been eliminated.

Similar problems are involved also with still another type of contact, as will be discussed below.

Referring to FIG. 4a, there is shown another example of the prior art in which a wiring board 2 has formed on its surface a brazing pad 22 on which is deposited a weld brazing material 3 which is adapted to be heat-fused to braze a terminal section 111 of a contact 11 to the brazing pad 22.

In this example of the prior art as well, when the weld brazing material 3 is heat-fused, it is drawn up along the surface 111A of the terminal section 111 while wetting the surface 111A of the terminal section 111 as shown in FIG. 4b until it rises up to the contact section 112 to wet the surface 112A thereof as shown in FIG. 4c, whereby the weld brazing material 3 is correspondingly short in the bonding region between the terminal section 111 and the brazing pad 22. The line B shows a boundary line between the surfaces 111A and 112A.

SUMMARY OF THE INVENTION

Accordingly, an object of this invention is to provide an electronic component which has overcome the aforesaid problems and a novel method of manufacturing the same.

According to one aspect of the present invention, an improved contact 11 is obtained by forming a base member of a contact having terminal and contact sections and a surface thereof which is poorly wettable with respect to a weld brazing material 3, forming a finish plating layer made of a material which is highly wettable to the weld brazing material on the poorly wettable surface of the base member and then selectively removing a portion of the finish plating layer so as to define an exposed portion for exposing the poorly wettable surface. The thus exposed portion is served as the arresting region for arresting creeping-up of said weld brazing material.

According to another aspect of the invention, an improved contact is obtained by forming a base member of a contact having terminal and contact sections and made of a material which is poorly wettable to the weld brazing material, forming a primer plating layer on the base member, forming a finish plating layer made of a material which is highly wettable to the weld brazing material on the primer plating layer, and then selectively removing both a portion of the finish plating layer and a portion of the primer plating layer at a region of the terminal section along which the molten brazing material creeps up so as to define an exposed portion of the poorly wettable base member member. The thus exposed portion is served as the arresting region for arresting creeping-up of said weld brazing material.

This improved contact 11 is brazed to a wiring board to constitute an electronic component 10.

For the material of which the base member of the contact 11 is made, where the exposed surface region of the base member is utilized as the arresting means, it is preferable to use copper, copper alloy such as Cu—Ti, Cu—Be, Cu—Sn, Cu—Mg, Cu—Ni, and Cu—Zn alloy which may contain P or Si as additives, and other metals such as Co, Mn, Pb, Al, Fe, and SUS. As to the finish plating material applied to the surface of the contact 11, it is preferably to use gold, tin or tin alloy such as Sn—Ag, Sn—Cu, Sn—Cu—Ag alloy, and lead or lead alloy such as Pb—Sn alloy, and palladium or palladium alloy such as Pd—Ni, Pd—Co alloy.

According to still another aspect of the invention, a primer plating layer comprising a nickel alloy, such as Ni—P, Ni—S, or Ni—B alloy, may be applied to the surface of the base member of the contact 11 prior to forming the finish plating layer so as to enhance fastened formation of the finish plating.

If the primer plating layer as used is poorly wettable, it is possible to remove only a part of the finish plating to expose the primer plating to thereby use the thus exposed surface region of the primer plating as the arresting means. In this case, any kind of materials no matter whether it is conductor or non-conductor, such as plastics, ceramics, glass, may be used as the material to form the base member. It is, therefore, feasible to form a contact with terminal section and contact section in any desirable shape by molding of any suitable material, by forming a Ni alloy layer all over the surface of the contact through electro-less plating, by forming a finish gold plating on the primer plating, and by removing a part of the gold plating at the terminal section to thereby obtain an exposed portion 114 of the primer plating acting as the arresting means.

In the case where the base member is made of a poorly wettable material and it is also coated with the primer plating layer made of a highly wettable material, on which the finish plating layer of highly wettable material is formed, both the finish plating layer and the primer plating layer at the terminal section are partly removed to define the exposed portion of the base member. The thus exposed portion acts as the arresting means.

The process of selectively removing a portion of the highly wettable layer formed on the surface of the contact 11 to define the poorly wettable exposed portion 114 may be easily carried out with a good processing positional precision by applying the mechanical cutting or grinding (machining) technique, electric discharge machining technique, electron-beam machining technique or laser beam machining technique to the region in which the poorly wettable exposed portion 114 is to be formed.

DETAILED DESCRIPTION OF THE INVENTION

Figure 1:
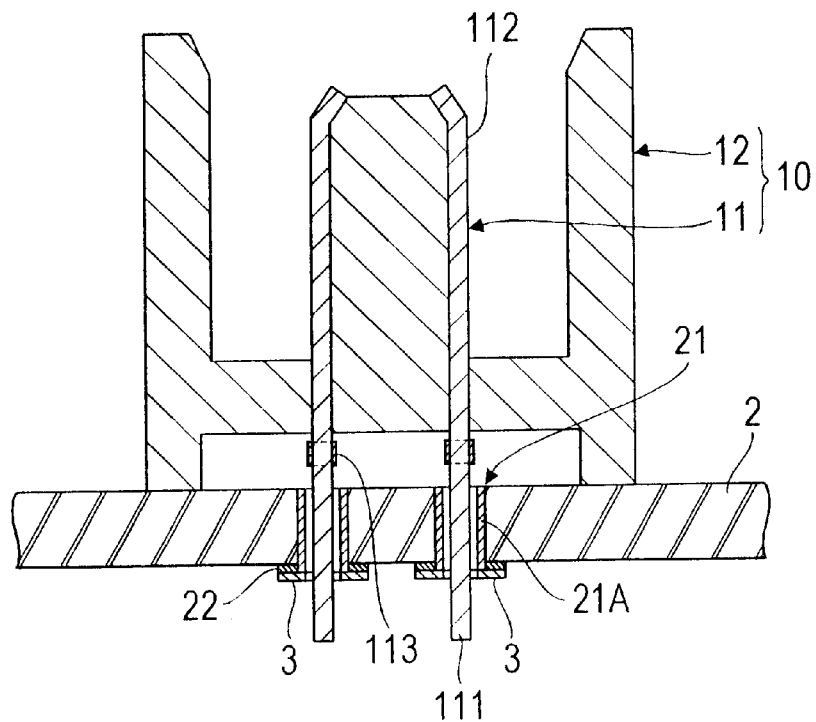
FIGS. 1 and 2 are cross-sectional views illustrating an example of the prior art.
Figure 2:
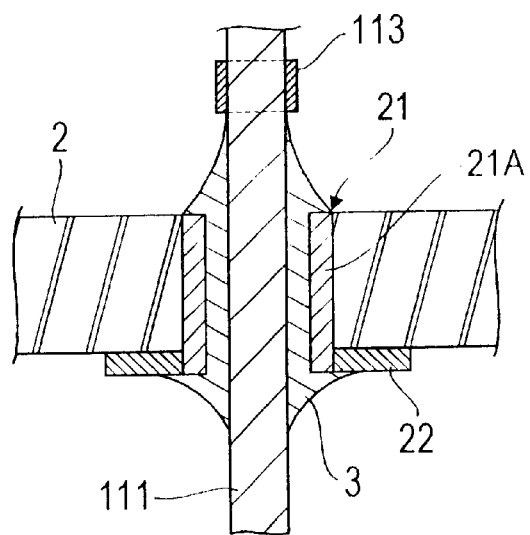

One embodiment of this invention will now be described with reference to FIGS. 5a to 5s. The parts in this embodiment that are similar to the parts shown in the prior art examples are indicated by like reference numerals.

Figure 5A:
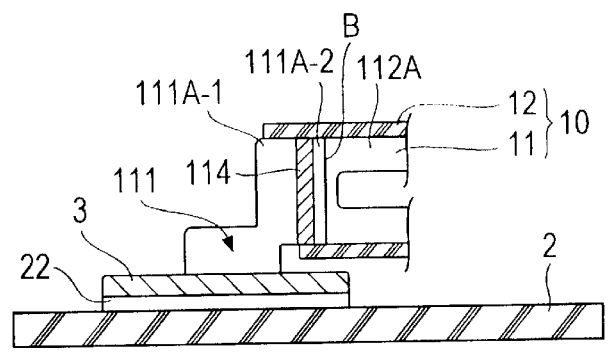
FIGS. 5a, 5b, 5c, 5q to 5s are side views.
Figure 5B:
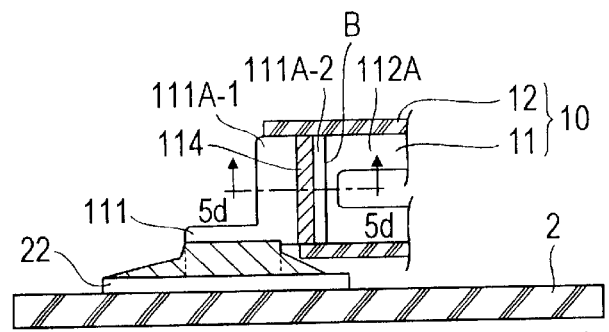
Figure 5C:
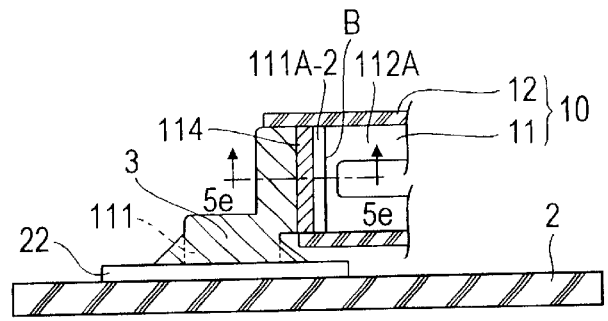
Figure 5D:
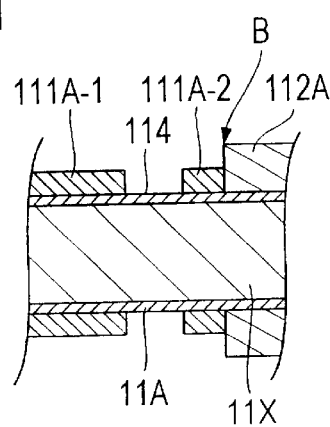
FIGS. 5d, 5e, 5g to 5p and 5t are cross-sectional view.
Figure 5E:
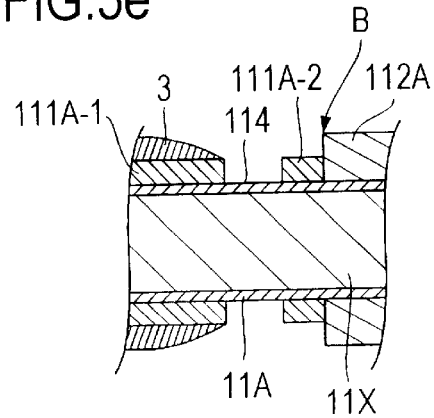
Figure 5F:
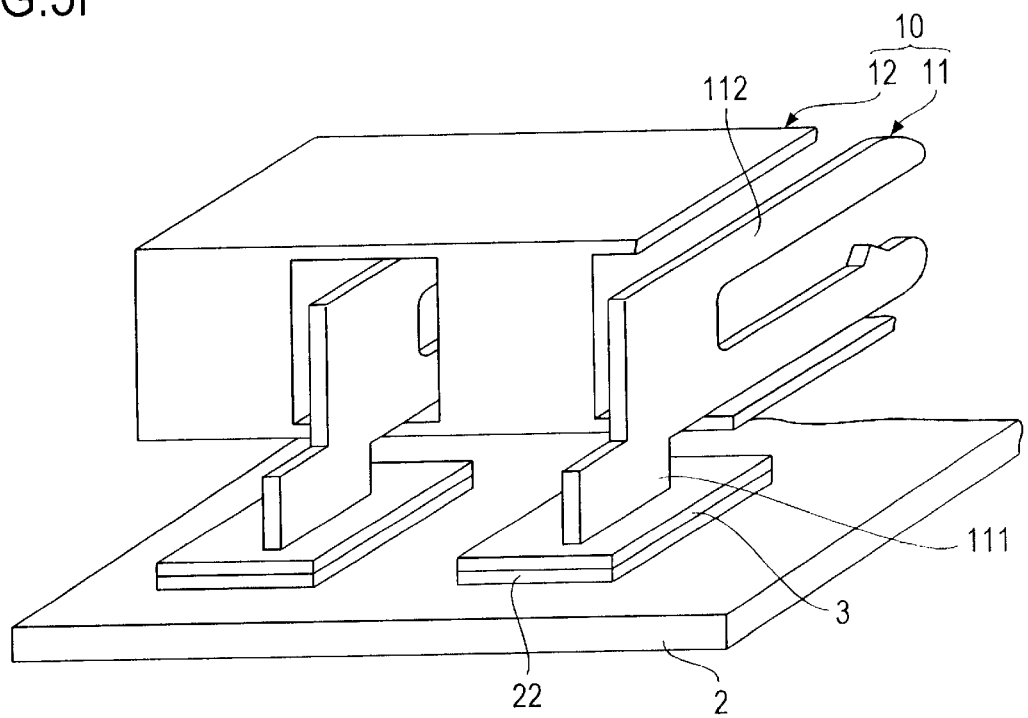
FIG. 5f is a perspective view, all illustrating an embodiment of the present invention.

As shown in FIG. 5f, an invented electronic component 10 comprises a contact 11 and an insulator housing 12.

In one embodiment as shown in FIGS. 5a to 5e, a brazing pad 22 is formed on a wiring board 2. As is well known in the art, the wiring board 2 has printed wiring (not shown) provided thereon which is bonded to the brazing pad 22. It is also to be noted that in some instances the printed wiring may be provided on the bottom surface (the undersurface as viewed upside down in the drawing) of the board 2 and be configured to be connected with the brazing pad 22 positioning on the top surface of the board by means of the through-hole and through-hole plating layer as illustrated in FIG. 1.

A terminal section 111 of the contact 11 is placed on the brazing pad 22 with a weld brazing material 3 such as solder interposed therebetween. The weld brazing material 3 is then heat-fused to braze the terminal section 111 to the brazing pad 22 deposited on the surface of the wiring board 2.

In this embodiment, a portion of the highly wettable region composed of a finish plating layer 111A formed on the surface of the contact 11 is selectively removed in the shape of a band or swath to expose the corresponding portion of the underlying primer plating layer of the terminal section 111 to thereby define a poorly wettable exposed or bare portion 114.

In this embodiment, a base member of the contact 11 is made of a metallic material such as copper or copper alloy and the finish plating layer formed on the surface of the base member of the contact 11 may be made of gold, tin or tin alloy, or lead or lead alloy.

In order to insure intimate bonding of a finish plating layer to the base member of the contact 11, the surface of the base member 11X of the contact 11 may be coated with a primer plating layer 11A prior to the finish plating. Such primer plating layer may suitably be a nickel alloy plating layer.

In the case that the finish plating layer is removed to expose the underlying primer plating layer of a nickel alloy, it has been experimentally found that the "creeping-up" of the molten weld brazing material 3 is prevented by the exposed nickel alloy layer since the nickel alloy plating layer is poorly wettable inherently or due to being naturally oxidized during the process of removal of the covering layer even if the nickel alloy plating layer is not forced to be oxidized. Accordingly, it will be appreciated that the step of confirming the formation of an oxide film as was the case with the prior art is not required.

Further, it should be noted that the exposed portion 114 is formed in the shape of a band having a predetermined width at a location in that portion of the finish plating layer 111A for brazing formed on the surface of the terminal section 111 of the contact 11 adjacent the contact section 112 and the finish plating layer 111A is divided into two spaced apart portions 111A-1 and 111A-2 by the exposed portion 114.

Referring to FIG. 5a, it illustrates the weld brazing material 3 being put on the brazing pad 22 formed on the surface of the wiring board 2 and then the terminal section 111 of the contact 11 coated thereon with the finish plating layer being brought into engagement with the weld brazing material 3 in an unheated state.

FIG. 5b illustrates the fused weld brazing material 3 having started to creep up the terminal section 111 while wetting the surface thereof.

In this embodiment, the contact section 112 is required to have a highly electric conduction with an associated component while the terminal section 111 is requires to have a highly wettable state with respect to the weld brazing material, it is preferably to be so constituted that the finish plating layer regions at the respective terminal and contact sections are made of different materials or made of the same material but different in thicknesses. Accordingly, there exists a visually recognizable boundary line B between the respective finish plating layer regions 111A and 112A.

FIG. 5d is a cross-sectional view taken along the line 5d—5d in FIG. 5b.

FIG. 5c illustrates the fused weld brazing material 3 having moved up along the terminal section 111 until the material reaches the poorly wettable exposed portion 114 according to this invention, which the fused weld brazing material 3 cannot overreach to thereby be prevented from creeping and migrating any farther.

Figure 4A:
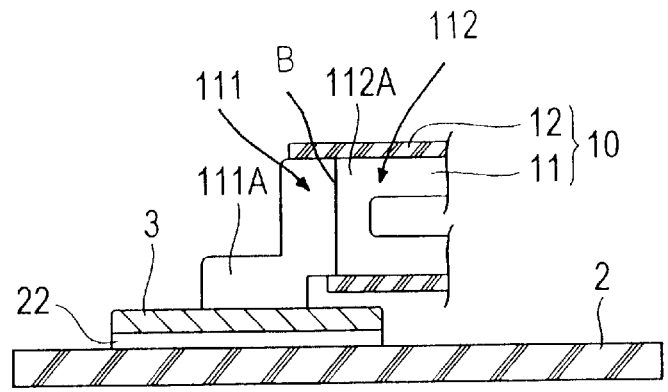
FIGS. 4a, 4b, and 4c are side views illustrating yet another example of the prior art.
Figure 4B:
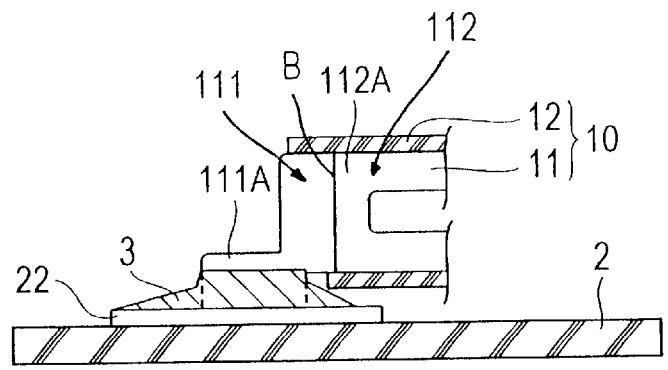
Figure 4C:
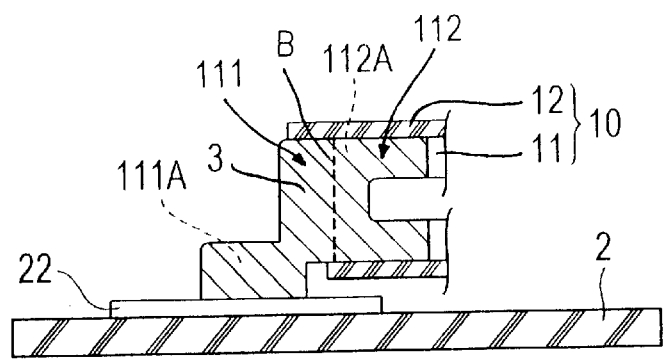

FIG. 5e is a cross-sectional view taken along the line 5e—5e in FIG. 5c. It will be appreciated that since there is no poorly wettable exposed portion 114 in the prior art as seen in FIG. 4c, the fused weld brazing material 3 having reached the surface of the terminal section 111 would farther creep up to reach the contact section 112, resulting in a shortage in the amount of the weld brazing material 3 in the bonding region between the terminal section 111 and the brazing pad 22. However, such creeping-up migration is prevented by the presence of the poorly wettable exposed portion 114 according to this invention.

FIGS. 5g to 5k show various formations of the exposed region 114 where the primer plating layer 11A made of poorly wettable material is formed as the exposed portion 114, wherein the base member may be made of any kind of materials without being restricted to conductor materials.

Figure 5G:
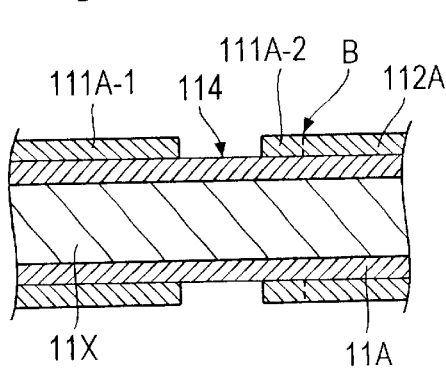

In the case of FIG. 5g, the finish plating layers 111A and 112A at both the terminal and contact sections are made of the same material with the same thickness, so that no boundary line B between the two plating layers in fact exists though the exposed portion 114 of the primer plating layer is formed in the plating layer 111A of the terminal section 111.

Figure 5H:
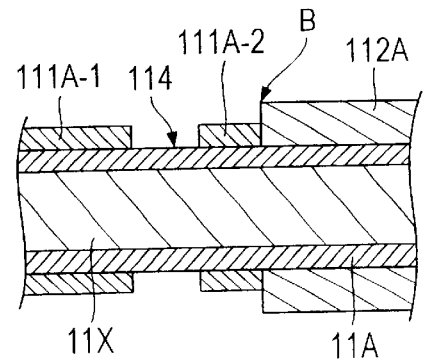

FIG. 5h, on the contrary, illustrates the case where both the finish plating layers corresponding to the terminal and contact sections are made of different materials or made of the same material but different in thickness, namely the layer 111A of the terminal section is thinner than that 112A of the contact section, wherein the exposed portion 114 of the primer plating layer is formed in the plating layer 111A. (This case is substantially the same as FIG. 5d.)

Figure 5I:
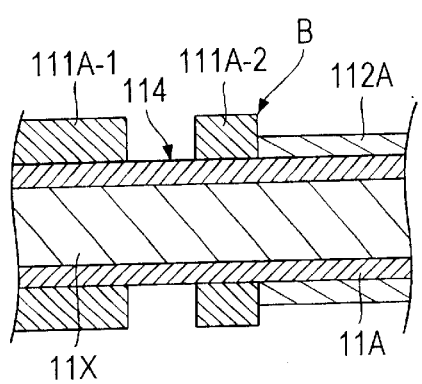
Figure 5J:
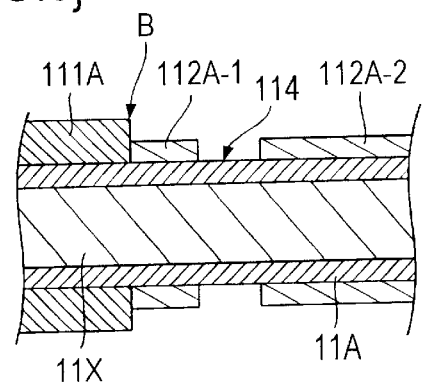
Figure 5K:
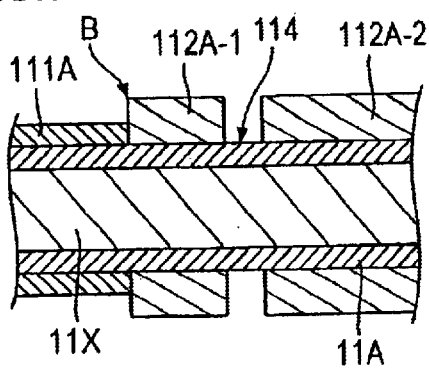

FIG. 5i illustrates the case where both the finish plating layers corresponding to the terminal and contact sections are made of different materials or made of the same material but different in thickness, namely the layer 111A of the terminal section is thicker than that 112A of the contact section, wherein the exposed portion 114 of the primer plating layer is formed in the plating layer 111A FIG. 5j illustrates the case where both the finish plating layers corresponding to the terminal and contact sections are made of different materials or made of the same material but different in thickness, namely the layer 111A of the terminal section is thicker than that 112A of the contact section, wherein the exposed portion 114 of the primer plating layer is formed in the plating layer 112A FIG. 5k illustrates the case where both the finish plating layers corresponding to the terminal and contact sections are made of different materials or made of the same material but different in thickness, namely the layer 111A of the terminal section is thinner than that 112A of the contact section, wherein the exposed portion 114 of the primer plating layer is formed in the plating layer 112A.

FIGS. 5l to 5p illustrate different embodiments where both the finish plating layer and the primer plating layer are selectively (partly) removed to expose the corresponding portion of the underlying base member 11X made of a poorly wettable material at the terminal section 111 to thereby define a poorly wettable exposed portion 114, wherein the base member may preferably be made of poorly wettable material or of any such a material that can become poorly wettable during the removing processing of the plating layer by means of such as laser irradiation. In this case, the primer plating layer is not restricted to be of poorly wettable material.

Figure 5L:
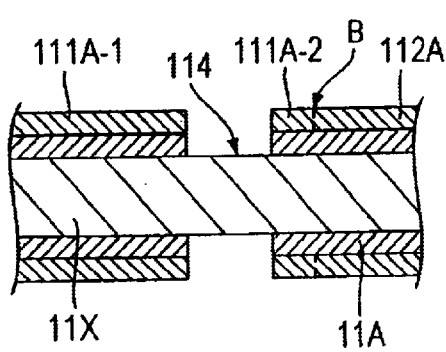

In the case of FIG. 5l, the finish plating layers 111A and 112A at both the terminal and contact sections are made of the same material with the same thickness, so that no boundary line B between the two plating layers in fact exists though the exposed portion 114 of the base member 11X is formed in both the finish and primary plating layers at the terminal section 111.

Figure 5M:
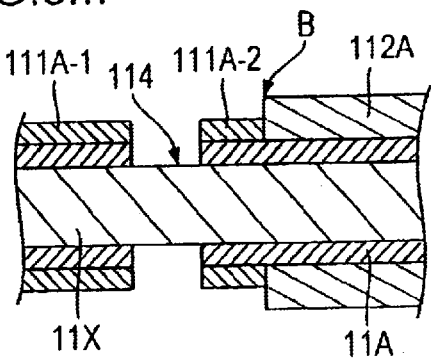

FIG. 5m illustrates the case where both the finish plating layers corresponding to the terminal and contact sections are made of different materials or made of the same material but different in thickness, namely the layer 111A of the terminal section is thinner than that 112A of the contact section, wherein the exposed portion 114 of the base member 11X is formed in both the finish and primary plating layers at the terminal section 111.

Figure 5N:
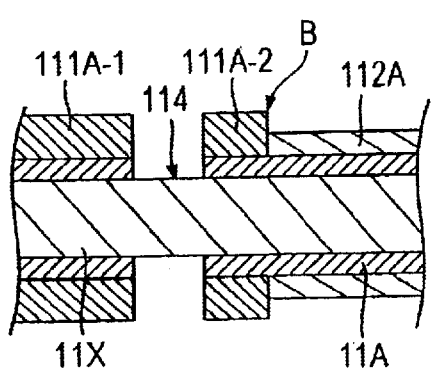

FIG. 5n illustrates the case where both the finish plating layers corresponding to the terminal and contact sections are made of different materials or made of the same material but different in thickness, namely the layer 111A of the terminal section is thicker than that 112A of the contact section, wherein the exposed portion 114 of the base member 11X is formed in both the finish and primary plating layers at the terminal section 111.

Figure 5O:
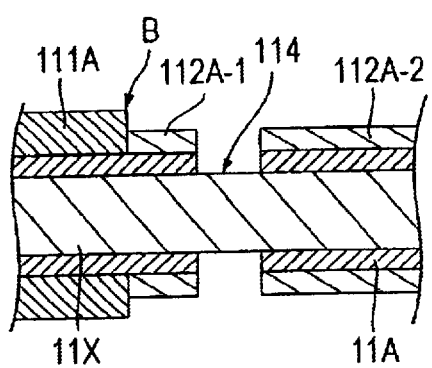

FIG. 5o illustrates the case where both the finish plating layers corresponding to the terminal and contact sections are made of different materials or made of the same material but different in thickness, namely the layer 111A of the terminal section is thicker than that 112A of the contact section, wherein the exposed portion 114 of the base member 11X is formed in both the finish and primary plating layers at the contact section 112.

Figure 5P:
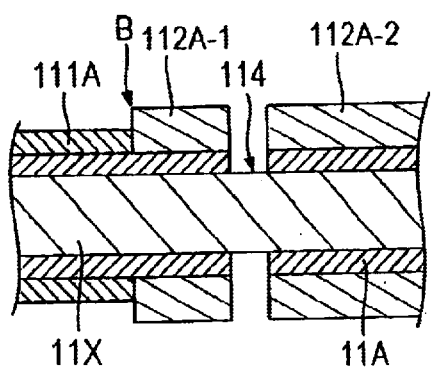

FIG. 5p illustrates the case where both the finish plating layers corresponding to the terminal and contact sections are made of different materials or made of the same material but different in thickness, namely the layer 111A of the terminal section is thinner than that 112A of the contact section, wherein the exposed portion 114 of the base member 11X is formed in both the finish and primary plating layers at the contact section 112.

It may be well understood that when no primer plating layer is used in these cases of FIGS. 5g to 5p, the exposed portion 114 of the base member 11X can be easily formed by partially removing only the finish plating layer.

In this embodiment, laser beam machining technique is preferably used in order to partially and selectively remove the finish plating layer alone or both the finish plating layer and the primer layer to thereby form the exposed portion of the poorly wettable surface. However, as described in the summary of the invention, other machining techniques, such as the mechanical cutting or grinding (machining) technique, electric discharge machining technique, or electron-beam machining technique, may also be used.

Further, the shape and position of the exposed portion 114 of the poorly wettable surface to be formed is not restricted to a band shape as shown in the above-described embodiment.

Figure 5T:
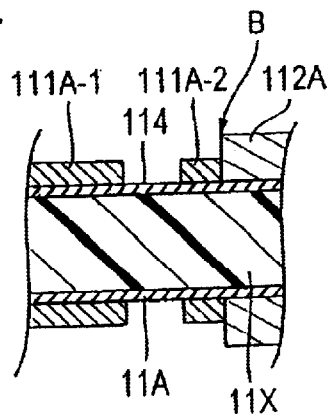
Figure 5Q:
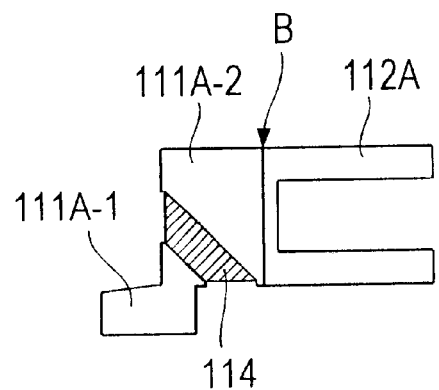
Figure 5R:
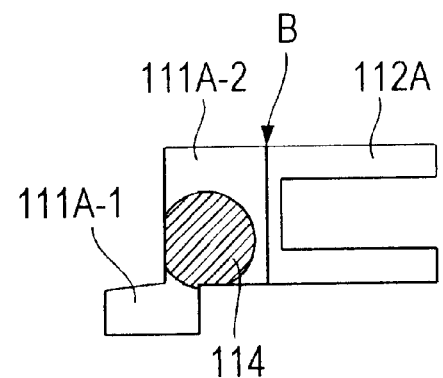
Figure 5S:
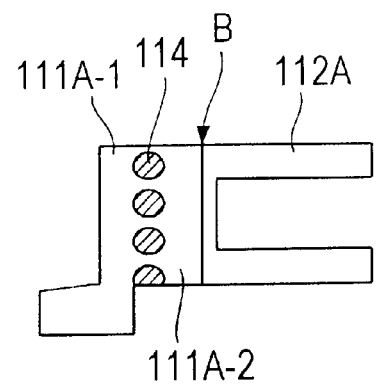

In other words, the exposed portion 114 may have various shapes in the finish plating layer 111A, for examples as shown in FIGS. 5q to 5s.

Particularly in FIG. 5s, a plurality of substantially circular-shape exposed portions having a diameter of 0.1 mm with a distance of 0.1 mm between mutually adjacent exposed portions are effective for arresting the weld brazing material.

FIG. 5t illustrates an embodiment of the present invention that is substantially the same as the embodiment shown in FIG. 5d except that the figure includes hatching to show base member 11X is made of a non-conductive material. This figure is included to clearly show the base member may be formed from any type of non-conductive material such as plastics, ceramics or glass in addition to being formed from conductive materials.

Figure 3A:
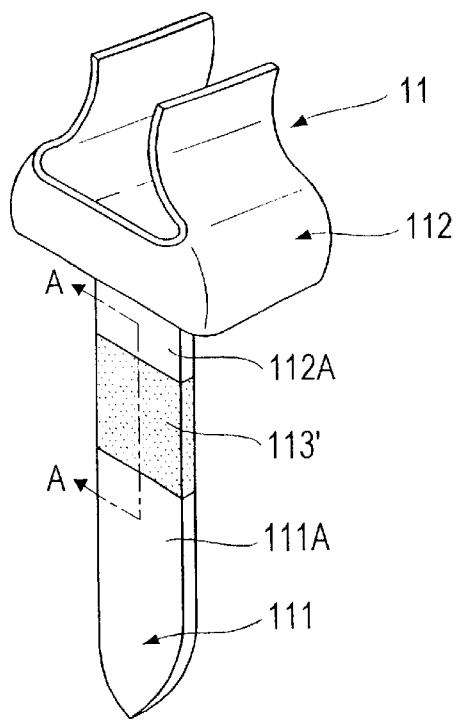
FIG. 3a is a perspective view.
Figure 3B:
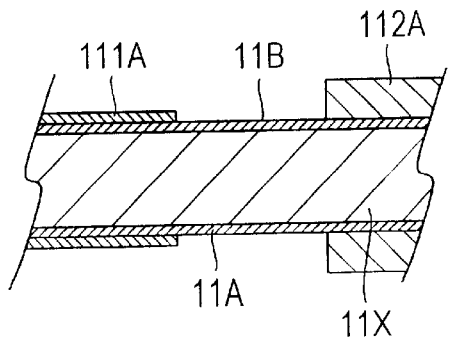
FIGS. 3b and 3c are cross-sectional views, all illustrating another example of the prior art.
Figure 3C:
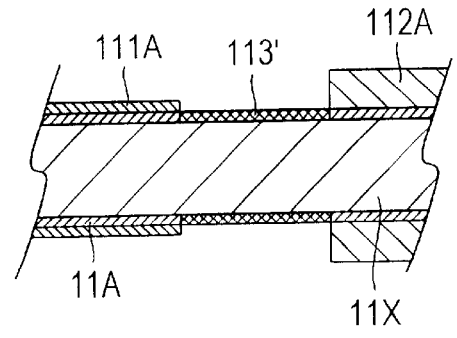

FIGS. 6a to 6d illustrate another embodiment of the present invention which is an improvement over the contact of the prior art as shown in FIGS. 3a to 3c. Again, the parts in this embodiment that are similar to the parts shown in the other drawings are indicated by like reference numerals.

As described hereinbefore, in the prior art of FIGS. 3a to 3c, a primer layer 11A comprising a nickel plating layer is formed over the surface of the base member 11X of the contact 11 by the use of the plating technique, followed by forming a relatively thick gold plating 112A of 0.4 $\mu$m thickness for the contact section 112 while forming a relatively thin gold plating layer 111A of 0.05 $\mu$m thickness for brazing use on the terminal section 111, with a predetermined spacing (0.3 mm) therebetween so as to define an exposed section 11B having the corresponding predetermined width (0.3 mm) (FIG. 3b), whereafter the exposed section 11B of the nickel plating layer is transformed into a nickel oxide layer 113' by anodic oxidation (FIG. 3b) to define an arresting region for arresting the creeping-up of the molten weld brazing material.

Figure 6A:
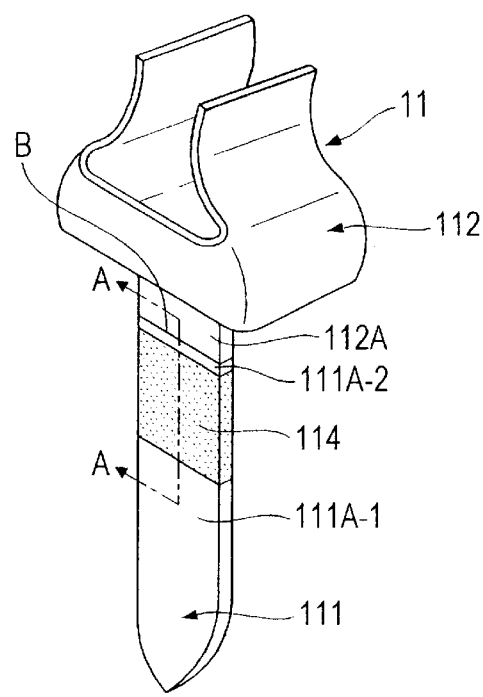
FIG. 6a is a perspective view.
Figure 6B:
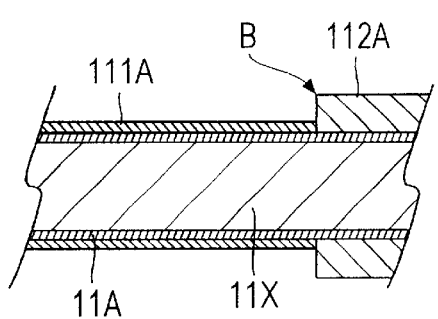
FIGS. 6b and 6c are cross-sectional views, and 6d illustrate another embodiment of the present invention.

In contrast, according to this invention, as shown in FIG. 6b, a primer layer 11A is formed over the surface of the contact base member 11X, followed by forming a gold plating 112A for the contacting purpose on the side of the contact section 112 while forming a gold plating layer 111A for the brazing purpose on the side of the terminal section 111. It should be noted here that it is not required to provide a predetermined spacing between the two plating layers as is required in the prior art.

Figure 6C:
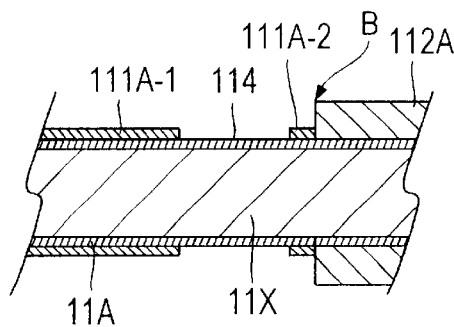
Figure 6D:
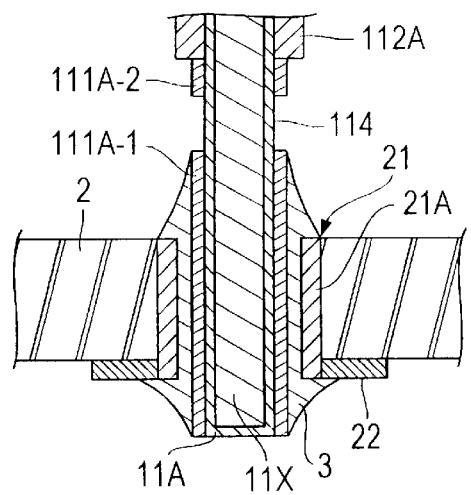

Next, as shown in FIG. 6c, a portion of the gold plating layer 111A on the side of the terminal section 111 near the contact section 112 is removed in the form of a band completely around the surface of the terminal section to expose a corresponding portion of the primer layer 11A to thereby define a poorly wettable bare portion 114.

This divides the gold plating layer 111A into two spaced apart portions 111A-1 and 111A-2.

When the thus obtained contact 11 is mounted to a wiring board 2 having a through-hole 21 coated with a through-hole plating layer 21A and a weld brazing material 3 and then the brazing material 3 is fused, the brazing material will creep up along one portion 111A-1 of the two divided portions of the gold plating layer on the side of the terminal section 111, but it is prevented by the poorly wettable exposed portion 114 from creeping up any farther beyond the exposed portion 114 and cannot reach the other portion 111A-2 of the two divided portions of the gold plating layer on the side of the terminal section or the gold plating 112A on the side of the contact section 112.

In addition, it should be noted that the location where the poorly wettable exposed portion 114 is to be defined may be either at the joint region between the gold plating layer 111A on the terminal section side and the gold plating 112A on the contact section side or in the region of the gold plating 112A on the contact section side near the terminal section.

As discussed above, according to this invention, a portion of the highly wettable surface layer for a weld brazing material formed on a contact of an electronic component is removed to expose a corresponding portion of either the base member or the primer layer which is poorly wettable to thereby define a poorly wettable exposed surface portion 114, whereby the creeping-up of the weld brazing material may be arrested at the exposed portion.

In the aforementioned description, the base member has a poorly wetable surface and the primer plating layer is different object from the base member. It may, however, be understood that the primer plating layer is a part of the base member member and thus the primer plating layer made of a poorly wettable material may constitute the poorly wettable surface of the base member member.

In addition, since the accuracy in the location as well as the width dimension of the poorly wettable exposed portion to be formed is not affected by the processing precision of the primer plating and finish plating, it is possible to determine a proper location where a poorly wettable exposed portion is to be formed directly from the standard dimensions of the electronic component and to obtain such poorly wettable exposed portion at that location by partly removing the highly wettable coating with a high precision with respect to the location and area (width dimension) by utilizing any one of the processing techniques as mentioned above.

In this regard, it should be appreciated that in contrast to the processing techniques involving a liquid such as plating and coating as used in the prior art, the processing techniques handling a solid such as removing the highly wettable coating according to the present invention is more suitable to enhance both the positional accuracy and the dimensional accuracy, leading to enhancement of the feasibility of volume production.

Moreover, it is easy to visually determine the location and area of the poorly wettable exposed portion formed by material removal, contributing to facilitating the dimensional control and enhancement of volume productivity.

What is claimed is:

1. An electronic component comprising a contact having a terminal section for brazing and a contact section, said contact comprising:
    a base member having a surface which is poorly wettable to a weld brazing material, wherein a primer plating layer made of a material which is poorly wettable to said weld brazing material is formed on said base member to form the poorly wettable surface thereof;
    a finish plating layer formed on said primer plating layer, said finish plating layer being made of a material which is highly wettable to the weld brazing material; and
    an exposed region of the poorly wettable surface of said base member in said terminal section serving as an arresting region for arresting creeping-up of said weld brazing material, wherein said region is formed in a portion of the finish plating layer by an exposed portion of said primer plating layer.

2. The electronic component according to claim 1, wherein
    said base member is made of a conductor, and
    said primer plating layer formed on the base member is a nickel alloy plating layer.

3. The electronic component according to claim 1, wherein
    said base member is made of a non-conductor, and
    said primer plating layer formed on the base member of said contact is a nickel alloy plating layer.

4. The electronic component according to claim 2 or 3, wherein said finish plating layer is any one of gold plating layer, tin or alloy plating layer, and lead or lead alloy plating layer.

5. An electronic component comprising a contact having a terminal section for brazing and a contact section, said contact comprising:
    a base member having a surface which is poorly wettable to a weld brazing material, wherein a primer plating layer made of a material which is poorly wettable to said weld brazing material is formed on said base member to form the poorly wettable surface thereof;
    a first finish plating layer formed on said primer plating layer at the terminal section;
    a second finish plating layer formed on said primer plating layer at the contact section, said first and second finish plating layers being made of a material which is highly wettable to the weld brazing material and formed integrally contacted to each other; and
    an exposed region of said primer plating layer formed in the first finish plating layer and/or the second finish plating layer serving as an arresting region for arresting creeping-up of said weld brazing material.

6. The electronic component according to claim 5 wherein the exposed region is formed only in the second finish plating layer.

7. The electronic component according to claim 5 wherein the exposed region is formed in the joint region between the first and second finish plating layers.

8. The electronic component according to claim 5, wherein the exposed region is formed only in the first finish playing layer.

9. The electronic component according to any one of claims 5 through 8, wherein
    said base member is made of a conductor; and
    said primer plating layer formed on the base member is a nickel alloy plating layer.

10. The electronic component according to claim 9, wherein said finish plating layer is any one of gold plating layer, tin or alloy plating layer, and lead or lead alloy plating layer.

11. An electronic component according to any one of claims 5 through 8, wherein
    said base member is made of a non-conductor; and
    said primer plating layer formed on the base member of said contact is a nickel alloy plating member formed by electro-less plating technique.

12. The electronic component according to claim 11, wherein said finish plating layer is any one of gold plating layer, tin or tin alloy plating layer, and lead or lead alloy plating layer.

13. An electronic component comprising a contact having a terminal section for brazing and a contact section, said contact comprising:
    a base member having a surface which is poorly wettable to a weld brazing material, said base member is made of a material which is poorly wettable to said weld brazing material;
    a primer plating layer is formed on said base member;
    a first finish plating formed on said primer plating layer at the terminal section;
    a second finish plating layer formed on said primer plating layer at the contact section, said first and second finish plating layers being made of a material which is highly wettable to the weld brazing material and formed integrally contacted to each other; and an exposed region of the poorly wettable surface of said base member serving as an arresting region for arresting creeping-up of said weld brazing material, wherein said exposed region is formed in the first finish plating layer and/or the second finish plating layer.

14. The electronic component according to claim 13, wherein the exposed region is formed only in the first finish plating layer.

15. The electronic component according to claim 13, wherein the exposed region is formed only in the first finish plating layer.

16. The electronic component according to claim 13, wherein the exposed region is formed only in the joint region between the first and second finish plating layers.

17. The electronic component according to claim 13, 14, 15 or 16, wherein said primer plating layer is a nickel alloy plating layer.

18. The electronic component according to claim 13, 14, 15 or 16, wherein said finish plating layer is any one of gold plating layer, tin or tin alloy plating layer, and lead or lead alloy plating layer.

* * * * *

UNITED STATES PATENT AND TRADEMARK OFFICE
CERTIFICATE OF CORRECTION

PATENT NO. : 6,712,625 B2
DATED : March 30, 2004
INVENTOR(S) : Kazuhisa Saito et al.

It is certified that error appears in the above-identified patent and that said Letters Patent is hereby corrected as shown below:

Column 11,
Line 10, delete "first" and replace with -- second --.

Signed and Sealed this

Third Day of August, 2004

JON W. DUDAS
*Acting Director of the United States Patent and Trademark Office*